United States Patent
Lee et al.

[11] Patent Number: 6,057,228
[45] Date of Patent: May 2, 2000

[54] METHOD OF FORMING INTERCONNECTION FOR SEMICONDUCTOR DEVICE

[75] Inventors: Seung-Yun Lee, Seoul; Yong-Sup Hwang, Daeku; Chong-Ook Park, Daejeon; Dong-Won Kim, Sungnam; Sa-Kyun Rha; Jun-Ki Kim, both of Seoul, all of Rep. of Korea

[73] Assignee: LG Semicon Co., Ltd., Choongcheongbuk-Do, Rep. of Korea

[21] Appl. No.: 09/140,834

[22] Filed: Aug. 26, 1998

[30] Foreign Application Priority Data

Feb. 7, 1998 [KR] Rep. of Korea .................. 98/3580

[51] Int. Cl.$^7$ .................................................. H01L 21/00
[52] U.S. Cl. .................... 438/627; 438/734; 438/720; 438/742; 438/628; 438/629; 438/660; 257/751
[58] Field of Search .................. 438/627, 628, 438/629, 687, 688; 257/751, 762, 764, 763

[56] References Cited

U.S. PATENT DOCUMENTS

| 5,085,731 | 2/1992 | Norman et al. | 156/646 |
| 5,098,516 | 3/1992 | Norman et al. | 156/666 |
| 5,144,049 | 9/1992 | Norman et al. | 556/12 |
| 5,714,418 | 2/1998 | Bai et al. | 438/627 |
| 5,891,803 | 4/1999 | Gardner | 438/660 |
| 5,968,847 | 10/1998 | Ye et al. | 438/734 |
| 5,977,634 | 11/1999 | Bai et al. | 257/751 |

OTHER PUBLICATIONS

Kazuhide Abe, Yusuke Harada and Hiroshi Onoda; "Sub-Half Micron Copper Interconnects using Reflow of Sputtered Copper Films"; VMIC Conference, Jun. 27–29, 1995 ISMIC; pp. 308–314.

*Primary Examiner*—Tuan H. Nguyen
*Assistant Examiner*—Laura Schillinger
*Attorney, Agent, or Firm*—Morgan, Lewis & Bockius LLP

[57] ABSTRACT

The present invention relates to a method of forming an interconnection for a semiconductor device using copper. The method of the invention, including the steps of forming an insulating layer having a groove on a semiconductor substrate containing active elements; forming and depositing a copper thin film on the insulating layer including the groove; and reflowing the copper thin film, may reflow the copper thin film deposited on the semiconductor substrate having a high-step surface for less than 30 min. below 450° C., which show improved annealing conditions as compared with the conventional art. In addition, by reducing consumption of thermal energy in accordance with a low-temperature process, copper is restrained from being rapidly diffused through a silicon substrate, electrodes, etc. when forming the interconnection for the semiconductor device, thus improving productivity of the semiconductor devices.

10 Claims, 3 Drawing Sheets

FIG.6

| MATERIAL | MELTING POINT(°C) |
|---|---|
| Cu | 1085 |
| CuF | 908 |
| CuF | 785 |
| CuCl | 422 |
| $CuCl_2$ | 630 |
| CuBr | 488 |
| $CuBr_2$ | 498 |
| CuI | 602 |

METHOD OF FORMING INTERCONNECTION FOR SEMICONDUCTOR DEVICE

BACKGROUND OF THE INVENTION

1. Field of the Invention

The present invention relates to a semiconductor device, and more particularly to a method of forming an interconnection for a semiconductor device using copper which is suitable for an material for interconnections of a high-integrated and high-power semiconductor device.

2. Discussion of the Background

Generally, aluminum has been widely used as a conductive material for electrical interconnection of high-integrated circuits.

However, as a width of the interconnection has become narrower, resistance of aluminum has been of some significance to delay of a resistance-capacitance time (RC time) of a circuit, and also as a dimension thereof is decreased, a design rule is limited.

Accordingly, copper has recently replaced aluminum as an interconnection material for a semiconductor device since it has specific resistance, about 40% lower than aluminum, and has excellent electromigaration. Generally, Copper is formed by a damascene process.

Now, a method of forming a copper interconnection for a conventional semiconductor device with reference to the accompanying drawings.

In FIG. 1, an insulating layer 2 is formed on a semiconductor substrate 1 in which active elements are integrated, and a groove 2a is formed in the insulating layer 2. A copper thin film 3 is formed on the insulating layer 2 including the groove 2a by a sputtering deposition method. Here, when continuously depositing copper thereon by the sputtering deposition method in order to fill up the groove 2a, a void 5 is formed in the groove 2a as shown in FIG. 2.

Next, in order to remove the void 5 in the groove 2a, the semiconductor substrate 1 on which the copper thin film 2 is deposited is put into a vacuum furnace, and annealed for more than 1 hour at 500° C. or over in oxygen/hydrogen atmosphere. Thus, as shown in FIG. 3, the copper thin film 3 is flowed into the void 5 which is formed in the groove 2a, and thus the groove 2a is completely filled in without any void. Here, the above-described process is called a Cureflow process.

The conventional method of forming the copper interconnection for the semiconductor device applies the Cureflow process which requires more than 1 hour of an annealing time, and a temperature over 500° C. in the oxygen/hydrogen atmosphere in order to form a conformal copper layer without any void, thus reducing productivity of the semiconductor devices.

SUMMARY OF THE INVENTION

Accordingly, a principal object of the present invention is to provide a method of forming an interconnection for a semiconductor device that reflows a deposited copper thin film at lower annealing temperature and in shorter annealing time compared to the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming an interconnection for a semiconductor device includes the steps of: forming an insulating layer having a groove on a semiconductor substrate; forming and depositing a copper thin film on the insulating layer including the groove; and reflowing the copper thin film.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6 is a table showing melting points of copper and copper-halogenation materials.

DETAILED DESCRIPTION OF THE INVENTION

Reference will now be made in detail to the preferred embodiments of the present invention, examples of which are illustrated in the accompanying drawings.

Figure 1:
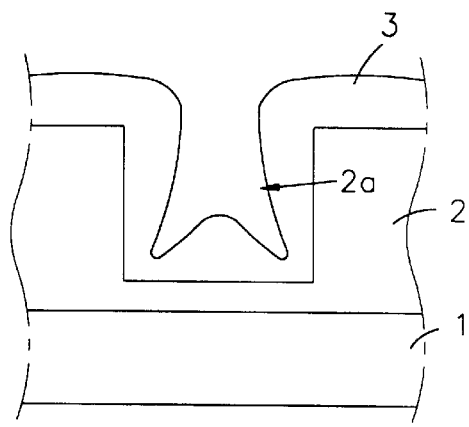
FIGS. 1 to 3 are vertical cross-sectional diagrams illustrating a conventional method of forming a copper interconnection for a semiconductor device.
Figure 2:
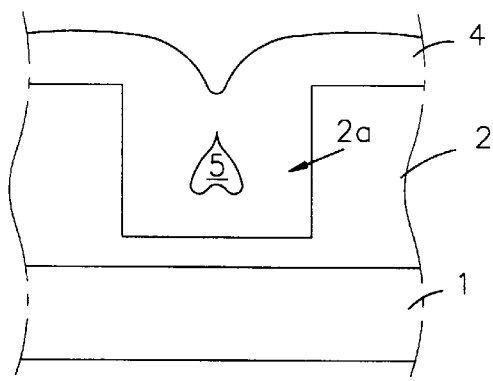
Figure 3:
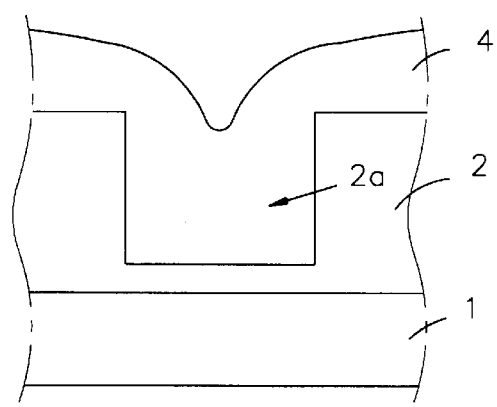
Figure 4:
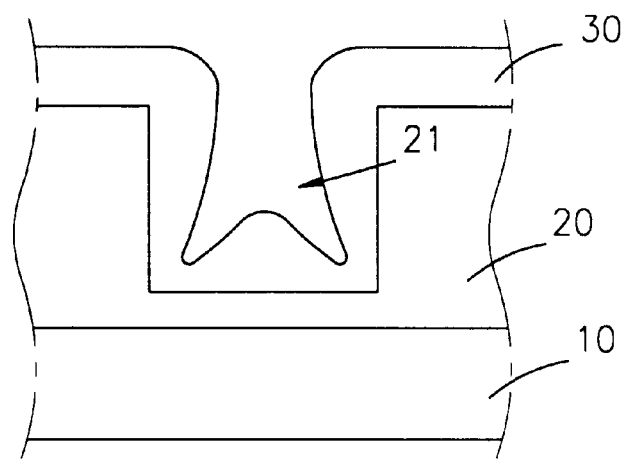
FIGS. 4 and 5 are vertical cross-sectional diagrams illustrating a method of forming a copper interconnection for a semiconductor device in accordance the resent invention.
Figure 5:
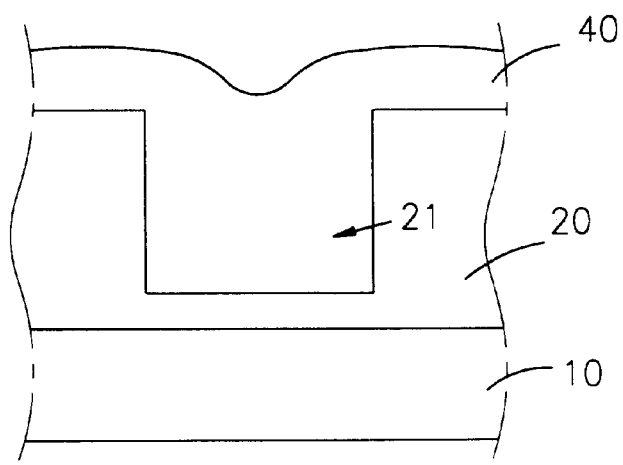

FIGS. 4 and 5 are vertical cross-sectional diagrams illustrating a method of forming a copper interconnection for a semiconductor device in accordance with the invention.

First, in FIG. 4, an insulating layer 20 having a groove 21 is formed on a semiconductor device 10 wherein active elements are integrated, and a copper thin film 30 is formed on the insulating layer 20 including the groove 21 by the sputtering deposition method.

Here, in order to completely fill up the groove 21, the semiconductor substrate 10 on which the copper thin film 2 is deposited is placed into a vacuum furnace, and annealed for less than 30 min. at 450° C. or lower in halogen gas atmosphere. As another method for filling up the groove 21, a small quantity of halogen gas is added when forming the copper thin film on the insulating layer, thus forming a copper-halogenation material, and the resultant semiconductor substrate 10 is annealed under the above-described condition. Here, migration of copper atoms is increased, and thus the copper thin film 30 is reflowed and the groove 21 is filled up without any void as shown in FIG. 5. Among $F_2$, $Cl_2$, Br, l which are halogen gases, $F_2$ and $Cl_2$ may be implanted as gaseous state, whereas Br or l may be put into a bubbler as liquid state and implanted as gaseous state by a bubbling method using Ar or He which is an inert gas, or implanted by using liquid MFC and a vaporizer. The halogen gases are removed by a purging process after the annealing process.

According to the copper reflow method in the halogen gas atmosphere, pressure of the halogen gas implanted in the furnace is maintained under $10^{-2}$ torr and the copper-halogenation material is formed only at a surface of the copper thin film. As shown in FIG. 6, since each meting point of copper-halogenation materials is considerably lower than that of copper, the copper-halogenation material formed at the surface of the copper thin film is fludized even at the above annealing temperatures.

Now, the principle of the copper reflow method in accordance with the invention will be described.

When K is curvature of a predetermined point of a surface of the thin film, chemical potential of each point of the surface thereof, $\mu=\mu_0+Kr\Omega$ (wherein r is surface tension, and $\Omega$ is volume of an atom). In FIG. 4, in case of depositing the copper thin film on the surface of the semiconductor substrate by the sputtering deposition method, since each point of the copper thin film has different surface curvature, the groove is filled in without any void due to surface diffusion of atoms according to chemical potential gradient of each surface point when thermal energy is applied.

As described above, the method of forming an interconnection for the semiconductor device by using copper according to the present invention may reflow the copper thin film deposited on the semiconductor substrate which has a high-step surface for less than 30 min. below 450° C., which show improved annealing conditions as compared with the conventional art. In addition, by reducing consumption of thermal energy in accordance with a low-temperature process, copper is restrained from being rapidly diffused through a silicon substrate, electrodes, etc. when forming the interconnection for the semiconductor device, thus improving productivity of the semiconductor devices.

It will be apparent to those skilled in the art that various modifications and variations can be made in the method of forming the interconnection for the semiconductor device of the present invention without departing from the spirit or scope of the invention. Thus, it is intended that the present invention cover the modifications and variations of this invention provided they come within the scope of the appended claims and their equivalents.

What is claimed is:

1. A method of forming an interconnection for a semiconductor device, comprising the steps of:

forming an insulating layer having a groove on a semiconductor substrate;

forming a copper thin film on the insulating layer including the groove; and reflowing the copper thin film in atmosphere comprising halogen gas.

2. The method of claim 1, wherein the copper thin film is formed by a sputtering deposition method, a chemical vapor deposition method, or an evaporation method.

3. The method of claim 1, wherein the steps of forming and reflowing the copper thin film are performed in an identical chamber.

4. The method of claim 1, wherein the copper thin film is reflowed at 450° C. or below.

5. The method of claim 1, wherein halogen gas is implanted among $F_2$, $Cl_2$, Br, or I, or combination thereof.

6. The method of claim 5, wherein $F_2$ or $Cl_2$ is implanted as gaseous state.

7. The method of claim 5, wherein Br or I is put into a bubbler as fluid, and implanted as gaseous state by a bubbling process using Ar and He which are inert gases or implanted by using liquid MFC and a vaporizer.

8. The method of claim 5, wherein pressure of the chamber is maintained under $10^{-2}$ torr during the step of reflowing the copper thin film in order that the copper-halogenation material is formed only at a surface of the copper thin film.

9. The method of claim 1, wherein the halogen gas reacts with the copper thin film, thus forming a copper-halogenation material at a surface of the copper thin film.

10. The method of claim 1, wherein a small quantity of halogen gas is added when depositing the copper thin film on the insulating layer including the groove.

* * * * *